(12) United States Patent
Khalin et al.

(10) Patent No.: US 6,680,616 B2
(45) Date of Patent: Jan. 20, 2004

(54) IN-SERVICE TESTING OF CURRENT TRANSFORMERS

(75) Inventors: Vladimir M. Khalin, Lexington, KY (US); Melren V. Mathis, Lexington, KY (US); Hayes K. Wyatt, Lexington, KY (US)

(73) Assignee: Kuhlman Electric Corporation, Versailles, KY (US)

( * ) Notice: Subject to any disclaimer, the term of this patent is extended or adjusted under 35 U.S.C. 154(b) by 38 days.

(21) Appl. No.: 10/059,553

(22) Filed: Jan. 28, 2002

(65) Prior Publication Data

US 2002/0109507 A1 Aug. 15, 2002

Related U.S. Application Data

(60) Provisional application No. 60/269,196, filed on Feb. 15, 2001.

(51) Int. Cl.$^7$ .......................... G01R 31/06; G01R 29/20
(52) U.S. Cl. ................. 324/547; 324/127; 324/726; 340/646
(58) Field of Search ................. 324/547, 726, 324/127, 546; 340/646; 361/143, 146, 149; 323/369, 358; 336/173

(56) References Cited

U.S. PATENT DOCUMENTS 6,331,768 B1 * 12/2001 Drori et al. .................. 323/369
6,522,517 B1 * 2/2003 Edel ............................ 361/143

* cited by examiner

*Primary Examiner*—N. Le
*Assistant Examiner*—Donald M Lair
(74) *Attorney, Agent, or Firm*—Harness, Dickey & Pierce, P.L.C.

(57) ABSTRACT

A system and method for testing an on-line current transformer is provided. The current transformer includes a primary winding and a secondary winding. An operating current continues to flow through the primary winding during testing of the current transformer. A controllable load is applied to the current transformer secondary winding. The controllable load is varied over a range of load settings including a maximum current setting and a maximum voltage setting. At a plurality of load settings within the range of load settings, a current flowing through the current transformer secondary winding is measured. Also, a voltage across the current transformer secondary winding is measured. An actual excitation curve is generated from the measured currents and voltages corresponding to the plurality of load settings.

24 Claims, 4 Drawing Sheets

IN-SERVICE TESTING OF CURRENT TRANSFORMERS

CROSS-REFERENCE TO RELATED APPLICATION

This application claims the benefit of U.S. Provisional Application No. 60/269,196, filed Feb. 15, 2001.

BACKGROUND AND SUMMARY OF THE INVENTION

The present invention relates generally to current transformers, and in particular to in-service testing of current transformers used in power generation and distribution systems.

Power generation and distribution systems use current transformers at numerous locations throughout the system as the primary sensor to monitor the current flowing through critical assemblies. The output of the current transformer provides a representation of the current flowing through the assembly that is being monitored. Associated monitoring and control instrumentation in combination with the current transformer may provide critical system functions such as overload protection and power usage monitoring. The importance to plant operation and reliability of current transformers cannot be over-emphasized. Problems with current transformers and associated monitoring and control instrumentation may cause very expensive and costly outages that are usually avoided at all costs. Therefore, it is imperative that these units be reliable and perform as designed at all times, and that the operating condition of a current transformer be known throughout its operating life.

However, using conventional techniques for evaluating the condition of a current transformer requires extensive downtime and associated expense. To evaluate a current transformer using conventional techniques, the primary conductor of the transformer must be disconnected from the assembly it is monitoring so that current flow through the primary is interrupted. Then, after the primary current is interrupted, a test current in accordance with IEEE specifications (IEEE C57.13 (1993) and ANSI C57.13.1 (1981)) is used to construct an excitation curve that reflects the operating characteristics of the current transformer. The excitation curve is then evaluated to determine if there are problems with the current transformer.

Since disconnecting the current transformer is expensive and requires extensive downtime, testing is rarely performed except when problems occur. However, waiting for a problem to occur results in unexpected outages which are very expensive in terms of lost generation capacity, labor, and materials, and of course substantial inconvenience to customers.

The present current transformer test system provides a method of testing a current transformer that has a primary winding and a secondary winding. An operating current continues to flow through the primary winding during testing of the current transformer. A controllable load is applied to the current transformer secondary winding. The controllable load is varied over a range of load settings including a maximum current setting and a maximum voltage setting. At a plurality of load settings within the range of load settings, a current flowing through the current transformer secondary winding is measured. Also, a voltage across the current transformer secondary winding is measured. An actual excitation curve is generated from the measured currents and voltages corresponding to the plurality of load settings.

For a more complete understanding of the invention, its objects and advantages, reference may be had to the following specification and to the accompanying drawings.

DETAILED DESCRIPTION OF THE PREFERRED EMBODIMENT

Figure 1:
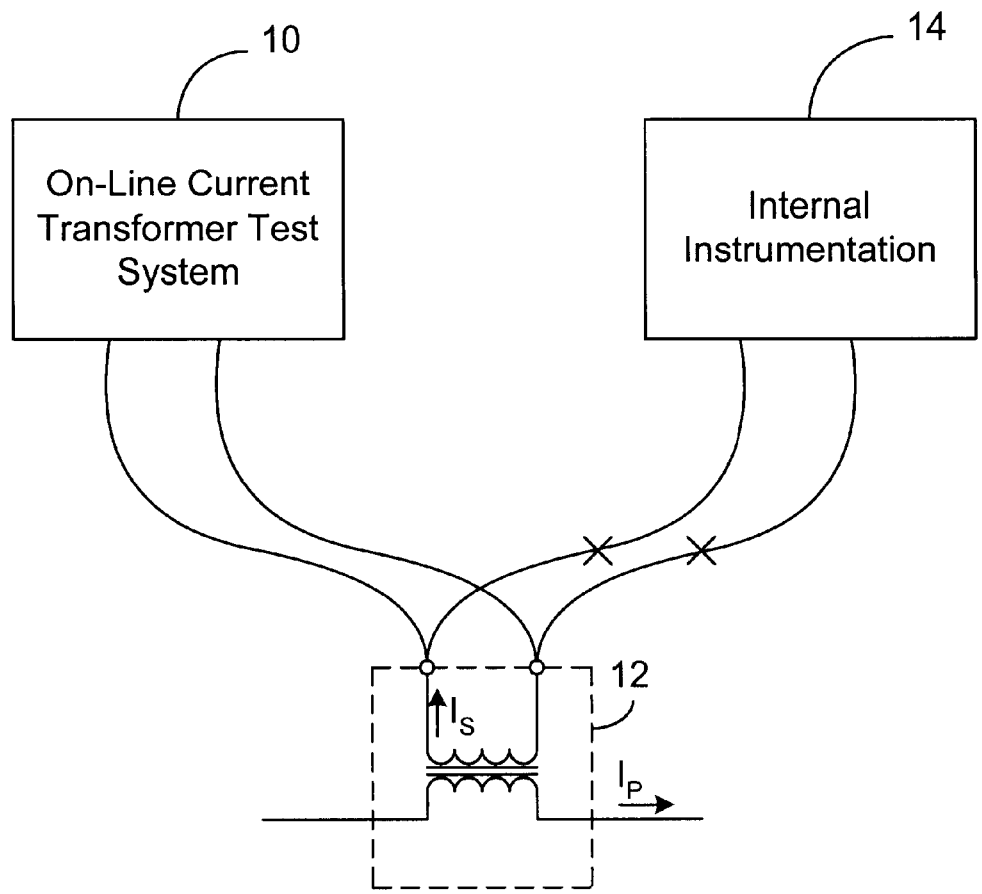
FIG. 1 illustrates a block diagram of a test instrument panel connected to a unit under test.

Referring to FIG. 1, an on-line current transformer test system 10 according to the present invention is shown connected to a current transformer 12. Internal instrumentation 14 associated with the current transformer 12 is preferably disconnected. However, the scope of the invention includes testing the current transformer with the internal instrumentation 14 connected. The on-line current transformer test system 10 is particularly suitable for evaluating current transformers used in power generation and distribution systems, since the system 10 does not require the disconnection of the current transformer 12 that is under test. Current transformers used in power generation and distribution systems are generally massive devices in which disconnection of the device requires extensive labor and down time. The test system 10 provides for on-line and in-service of a current transformer and associated monitoring and control loops. This is especially advantageous in power generation and distribution systems, where the down time for testing with conventional systems may result in millions of dollars in lost generation revenue.

Conventional current transformer testing methodologies in the power generation business, universally require the primary winding of the transformer to be disconnected before testing the current transformer. The primary winding is disconnected so that a voltage may be impressed across the secondary winding of the current transformer to evaluate the performance characteristics of that current transformer.

In contradistinction, the present invention impresses a range of burden impedances across the secondary winding of the current transformer 12 to evaluate the performance characteristics of the transformer 12. The primary winding preferably remains connected throughout the test. The secondary winding voltage and current values corresponding to increments in the burden impedance are used to generate an active performance curve representing the inverse excitation characteristics of the current transformer 12. A regressive analysis algorithm is applied to the inverse excitation characteristic to generate an actual excitation curve.

Figure 2:
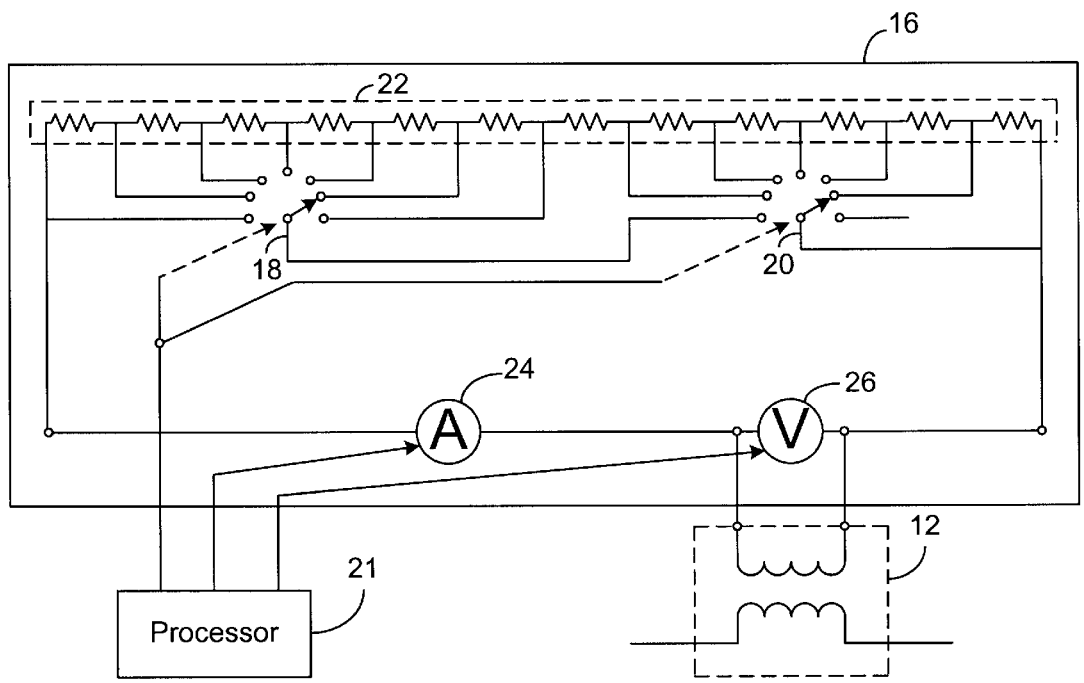
FIG. 2 illustrates a schematic diagram of a current transformer test system in accordance with the teachings of the invention.

Referring to FIG. 2, a schematic diagram of a current transformer test box 16 connected to a current transformer to be evaluated 12, is illustrated. The primary winding of the current transformer 12 preferably remains connected to the circuit for which the transformer 12 normally monitors current. Examples of typical current transformers that may be evaluated by the test system 10 include generator current transformers (GCTs) and bushing current transformers (BCTs). GCTs are typically used for protecting power generators and monitoring power generation output currents. BCTs are typically used for the monitoring and protection of substation transformers.

The current transformer test box 16 includes a burden impedance 22 connected in parallel with the secondary winding of the current transformer 12. Preferably, the burden impedance is a string of resistors. Two selector switches 18 and 20 are connected to several points within the string of resistors 22 so that a wide range of resistance values may be applied across the current transformer 12. The selector switches 18 and 20 are configured so that different combinations of resistors within the string of resistors 22 are shorted out depending on the position of the switches 18 and 20. An ammeter 24 is placed in series with the current transformer secondary winding to measure the secondary current. A voltmeter 26 is connected across the secondary winding to measure the secondary voltage. Although the test box 16 preferably includes discrete resistors in combination with manual switches, it is within the scope of the invention to automate the circuitry of the test box 16. For example, in an alternative embodiment of the presently preferred invention, a processor 21 is coupled to controllable switches and the string of resistors 22 to generate the actual excitation curve. In addition, an electronic load alone or in combination with the processor 21 may be used to generate the actual excitation curve. The scope of the invention also includes using a burden impedance such as a programmable current load or resistor-capacitor network instead of the string of resistors 22.

Figure 3:
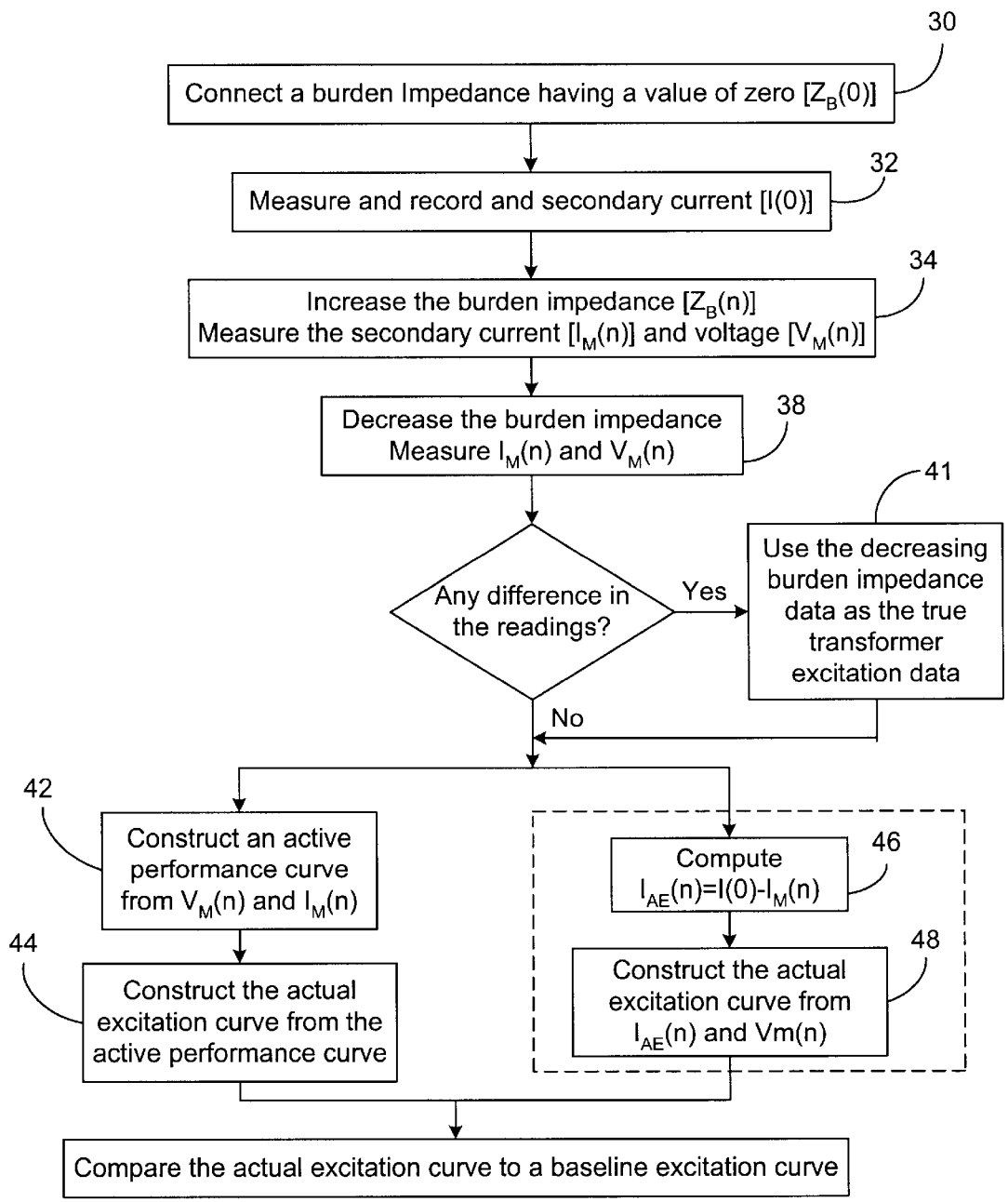
FIG. 3 illustrates a presently preferred embodiment of a process for testing a current transformer in accordance with the teachings of the invention.

Referring to FIG. 3 in addition to FIG. 2, a process for generating an actual excitation curve that characterizes the current transformer 12 is shown. At step 30, the burden impedance, Zb, 22 is connected to the secondary winding of the current transformer. The value of the burden impedance 22 is initially set to a minimum burden impedance. Preferably, the minimum burden impedance is zero ohms. Preferably, internal instrumentation circuits are disconnected to ensure that current flowing from the current transformer 12 flows into the test box 12. At step 32, the short circuit secondary current, Im(0), and voltage of the current transformer 12 are measured and recorded. At steps 34 and 36, the burden impedance 22 is increased and the secondary winding current, Im(n), and voltage, Vm(n), are measured and recorded. Steps 34 and 36 are repeated, with the impressed impedance being incrementally increased up to a maximum burden impedance that corresponds to either a selected secondary voltage or an impedance at which further increases in impedance result in no further increases in voltage. The selected secondary voltage may be chosen, for example, based upon the withstanding voltage of the current transformer and interconnect wiring. Although the minimum value of burden impedance is preferably zero ohms, the scope of the invention includes non-zero values of impedance so long as it is possible to interpolate Im(0) from the measured Im(n) at those impedance values.

At step 38, the burden impedance 22 is decreased and the secondary winding current, Im(n), and voltage, Vm(n), are measured and recorded. Step 38 is repeated, with the impressed impedance being incrementally decreased until the burden impedance is zero. Step 34 serves to demagnetize the current transformer 12 if the transformer 12 was magnetized at the start of the process. Step 39, determine whether there is a difference in readings between steps 34 and 38. If there is no difference in the readings, then the data provided by either of steps 34 and 38 may be used as the true transformer excitation data. Step 41, if there is a difference in readings, then the current transformer 12 was magnetized, and the true transformer excitation data is provided by step 38. Any difference in the readings represents measurement inaccuracies of the transformer current due to magnetization of the current transformer 12. The difference in readings may be used for manipulating previously obtained data associated with the current transformer 12. A process using differences in readings is presented in a later section of this specification.

Figure 4:
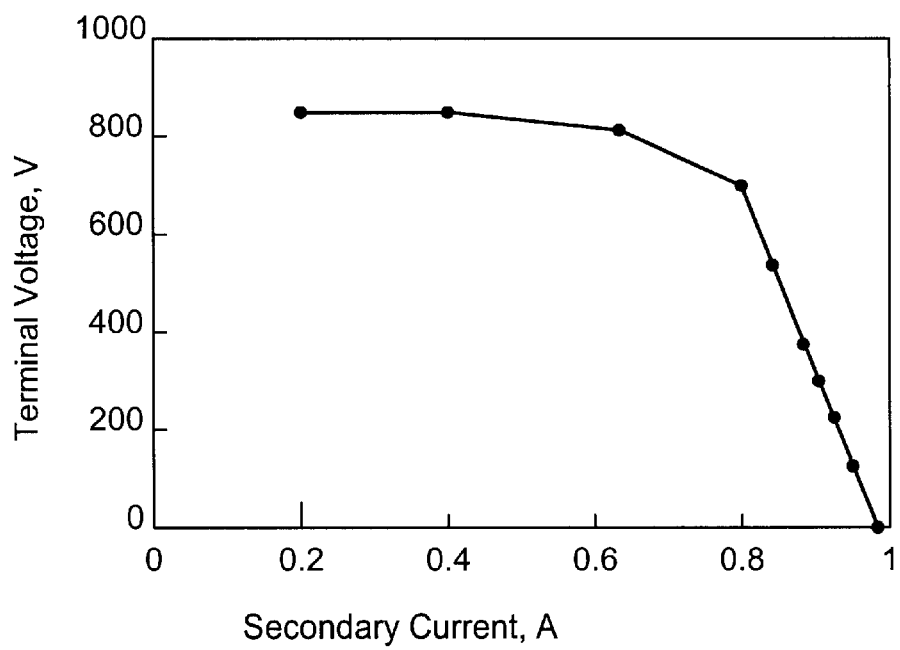
FIG. 4 is a graphical representation of an active performance curve.
Figure 5:
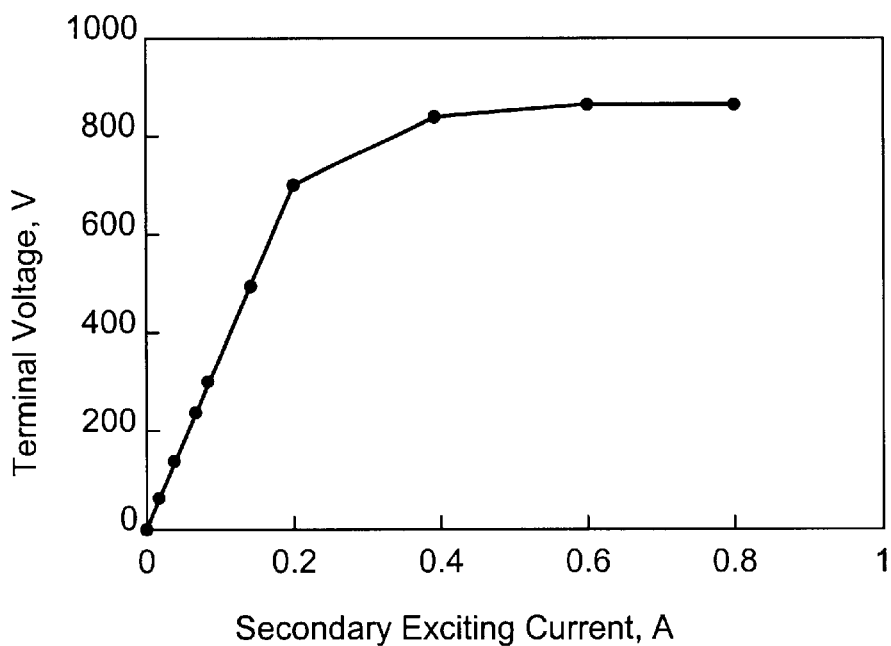
FIG. 5 is a graphical representation of an actual excitation curve.

Following step 39, the process splits, following one of two alternative paths. The preferred path follows steps 42 and 44. At step 42, an active performance curve is constructed from Vm(n) and Im(n) (see FIG. 4). The active performance curve illustrates the relationship between Vm(n) and Im(n) throughout the range of burden impedances. At step 44, an actual excitation curve is generated from the active performance curve by subtracting the measured current value, Im(n), corresponding to each burden impedance from the measured current value at zero burden impedance, Im(0). Using the derived current differences in combination with the values for Vm(n), the actual excitation curve is constructed (see FIG. 5). Although, Im(0) is preferably measured with a burden impedance of zero ohms, it is within the scope of the invention to interpolate a value for Im(0) such as by measuring the current at two or more different burden impedance values greater than zero, and then using a straight line approximation or curve fitting algorithm to compute Im(0).

The alternative path includes steps 46 and 48, and differs from the preferred path by eliminating the step of generating an active performance curve. Step 46 is integrated into step 34, so that as the current value, Im(n), corresponding to each burden impedance is measured, that value Im(n) is subtracted from the measured current value at zero burden impedance, Im(0), to generate the value of the actual excitation current, Iae(n). Here, the actual excitation curve is generated without the intermediate step of constructing an active performance curve.

At step 50, the actual excitation curve is compared to a baseline excitation curve to determine the operating condition of the current transformer 12 and the associated monitoring and control circuitry. The baseline excitation curve may be an excitation curve provided by the current transformer manufacturer, a previous actual excitation curve generated by the test system 10, or a theoretical magnetic materials performance curve for a similar current transformer.

In addition, the baseline excitation curve may be in a format that is comparable to the active performance curve. For example, previous active performance curves of the current transformer or similar current transformers may be stored as a baseline excitation curve for later comparison. As another example, the manufacturer's excitation curve may be converted into a compatible format to be compared directly with the active performance curve. The conversion may be made in a similar manner to constructing the actual excitation curve from the active performance curve. More specifically, the baseline curve may be obtained by subtracting the excitation current at all points within the manufacturer's excitation curve from Im(0) of the active performance curve.

Referring to FIG. 3, if at step 39 it is determined that there is a difference in readings between steps 34 and 38, then the current transformer 12 has been in a magnetized state. A magnetized current transformer provides an inaccurate measurement of the current levels flowing through the primary. Depending on the application of the current transformer 12, the inaccurate current representation will have a varying impact. For example, a magnetized current transformer that is used in a metering application to measure the quantity of current that is delivered to an entity will result in either undercharging or overcharging that entity for power. A magnetized current transformer that is used in a relaying application to protect a power system from the harmful effects of an overcurrent condition may indicate false overcurrent events, or even worse not provide an overcurrent indication at a current level that protects the system.

The difference in readings is used to manipulate previously obtained data associated with the current transformer 12. An inaccuracy number that is generated from the difference in readings is used to correct prior data. To generate the inaccuracy number, actual excitation curves for the magnetized and unmagnetized current transformer are generated and compared. The inaccuracy number may be computed as an average of the error over all operating currents, a subset of the operating currents such as the linear portion of the excitation curve, or as an error function that varies depending on the operating current. The inaccuracy number may be computed from either the active performance curves or the actual excitation curves. The inaccuracy number is then applied to previously obtained generator current data to extrapolate an estimated actual current corresponding to the prior data. In a metering application, the estimated actual current is used to adjust a previously determined power generation or power consumption.

While the present invention is shown and described as comprising a series of discrete manual steps, it will be appreciated that the on-line current transformer test system 10 can be implemented within an automated system such as a programmable load controlled by a microprocessor.

Thus it will be appreciated from the above that as a result of the present invention, an on-line current transformer test system for testing on-line current transformers is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. A method of in-service testing a current transformer having a primary winding and a secondary winding, the primary winding having an operating current flowing therethrough, comprising the steps of:
   a) applying a controllable load to the current transformer secondary winding;
   b) varying the controllable load over a range of load settings ranging between a minimum load setting and a maximum load setting, and at a plurality of load settings within the range of load settings:
      (i) measuring a current flowing through the current transformer secondary winding; and
      (ii) measuring a voltage across the current transformer secondary winding;
   c) generating an actual excitation curve from the measured currents and voltages corresponding to the plurality of load settings; and
   comparing the actual excitation curve to a baseline excitation curve to determine operating condition of the current transformer.

2. The method of claim 1 wherein the step of applying a controllable load comprises connecting a string of selectable resistors across the current transformer secondary winding.

3. The method of claim 1 wherein the step of constructing an actual excitation curve includes the steps of:
   determining a zero impedance secondary winding current;
   subtracting the measured current corresponding to one of the plurality of load settings such that an actual excitation current corresponding to the one of the plurality of load settings is computed;
   generating the actual excitation curve using the actual excitation current and the measured voltage corresponding to the plurality of load settings.

4. The method of claim 3 wherein the step of determining a zero impedance secondary winding current includes setting the minimum load setting to an impedance of zero ohms.

5. The method of claim 1 wherein the minimum load setting corresponds to an impedance of zero ohms.

6. The method of claim 1 further comprising the step of maintaining a constant current in the current transformer primary.

7. The method of claim 1 further comprising the step of demagnetizing the current transformer.

8. The method of claim 7 wherein the step of demagnetizing the current transformer includes the steps of:
   d) before executing step c), varying the controllable load from the minimum load setting to the maximum load setting, and at a plurality of load settings between the minimum and maximum load settings;
      i) measuring the current flowing through the current transformer secondary winding; and
      ii) measuring the voltage across the current transformer secondary winding; and
   e) further comprising the step of generating an inaccuracy number from the current and the voltage measured in steps c) and d).

9. The method of claim 8 further comprising the step of using the inaccuracy number to extrapolate an estimated actual current from previously obtained current transformer current data.

10. The method of claim 8 wherein the inaccuracy number represents an average error.

11. A method of in-service testing a current transformer having a primary winding and a secondary winding, the primary winding having an operating current flowing therethrough, comprising the steps of:
   a) maintaining the operating current at approximately a constant value;
   b) applying a burden impedance across the current transformer secondary;
   c) varying the burden impedance over a range of impedance settings ranging between a minimum impedance setting and a maximum impedance setting, and at a plurality of impedance settings within the range of impedance settings:
      (i) measuring a secondary current of the current transformer; and
      (ii) measuring a secondary voltage of the current transformer;
   d) constructing an active performance curve from the measured secondary current and secondary voltage;
   e) generating an actual excitation curve from the active performance curve; and
   f) comparing the actual excitation curve to a baseline curve to determine operating condition of the current transformer and associated monitoring and control circuitry.

12. The method of claim 11 wherein the step of applying a burden impedance comprises coupling a string of selectable burden resistors across the current transformer secondary.

13. The method of claim 11 wherein the plurality of impedance settings are predetermined.

14. The method of claim 11 wherein the plurality of impedance settings are selected based upon the measured secondary voltage.

15. The method of claim 11 wherein the step of generating an actual excitation curve from the active performance curve includes the steps of:
   determining a zero impedance secondary current;
   at each of the plurality of load settings;
      subtracting the measured secondary current corresponding to one of the plurality of load settings from the zero impedance secondary current such that an actual excitation current corresponding to the one of the plurality of load settings is computed;
   generating the actual excitation curve using the actual excitation current and the measured voltage corresponding to the plurality of load settings.

16. The method of claim 11 further comprising the step of demagnetizing the current transformer;
   wherein the step of applying a burden impedance comprises coupling a plurality of selectable burden resistors across the current transformer secondary; and
   wherein the step of generating an actual excitation curve from the active performance curve includes the steps of:
      determining a zero impedance secondary current;
      at each of the plurality of load settings;
         subtracting the measured secondary current corresponding to one of the plurality of load settings from the zero impedance secondary current such that an actual excitation current corresponding to the one of the plurality of load settings is computed; and
      constructing the actual excitation curve using the actual excitation current and the measured voltage corresponding to the plurality of load settings.

17. The method of claim 16 further comprising the step of generating an inaccuracy number representing a difference in measured currents and voltages between a magnetized transformer and an unmagnetized transformer.

18. The method of claim 17 further comprising the step of applying the inaccuracy number to measured currents associated with the magnetized transformer to extrapolate an estimated actual current.

19. The method of claim 17 wherein the inaccuracy number represents an average error.

20. A method of in-service testing a current transformer having a primary and a secondary, comprising the steps of:
   a) maintaining an operating current in the current transformer primary;
   b) demagnetizing the current transformer;
   c) coupling a controllable burden impedance across the current transformer secondary;
   d) varying the controllable burden impedance over a range of burden settings ranging from a minimum burden setting to a maximum burden setting, and at a plurality of burden settings within the range of burden settings;
      (i) measuring a current flowing through the current transformer secondary; and
      (ii) measuring a voltage across the current transformer secondary;
   e) generating an active performance curve from the measured current and voltage corresponding to the plurality of burden settings; and
   comparing the active performance curve to a baseline curve to determine operating condition of the current transformer and associated monitoring and control circuitry.

21. The method of claim 20 further comprising the step of generating an actual excitation curve from the active performance curve; and
   wherein the step of generating an actual excitation curve includes the steps of:
      determining a zero impedance secondary current;
      at each of the plurality of burden settings;
         subtracting the measured secondary current corresponding to one of the plurality of burden settings from the zero impedance secondary current such that an actual excitation current corresponding to the one of the plurality of burden settings is computed;
      generating the actual excitation curve using the actual excitation current and the measured voltage corresponding to the plurality of burden settings.

22. An on-line current transformer test system for testing a current transformer having a primary and a secondary, the current transformer primary having an operating current, comprising:
   a controllable load coupled across the current transformer secondary;
   a selector to vary the controllable load over a range of load settings ranging from a minimum load setting to a maximum load setting;
   a current measuring device to measure a current flowing through the current transformer secondary; a voltage measuring device to measure a voltage across the current transformer secondary; and
   a processor to construct an actual excitation curve from the measured current transformer secondary current and voltage,
   wherein the processor is further operable to compare the actual excitation curve to a baseline curve to determine operating condition of the current transformer and associated monitoring and control circuitry.

23. The current transformer test system of claim 22 wherein the selector is a multi-position switch.

24. The current transformer test system of claim 22 wherein the processor is further operable to generate an active performance curve from the measured current transformer secondary current and voltage.

* * * * *